US008927970B2

(12) United States Patent
Jeong et al.

(10) Patent No.: US 8,927,970 B2
(45) Date of Patent: Jan. 6, 2015

(54) ORGANIC ELECTROLUMINESCENCE DEVICE AND METHOD FOR MANUFACTURING THE SAME

(75) Inventors: Yun Sik Jeong, Busan-si (KR); Joon Young Heo, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 1009 days.

(21) Appl. No.: 12/209,760

(22) Filed: Sep. 12, 2008

(65) Prior Publication Data

US 2009/0072260 A1 Mar. 19, 2009

(30) Foreign Application Priority Data

Sep. 13, 2007 (KR) .................. 10-2007-0093077
Aug. 19, 2008 (KR) .................. 10-2008-0080687

(51) Int. Cl.
| | |
|---|---|
| *H01L 29/08* | (2006.01) |
| *H01L 27/32* | (2006.01) |
| *H01L 27/12* | (2006.01) |
| *H01L 29/417* | (2006.01) |
| *H01L 29/786* | (2006.01) |
| *H01L 29/45* | (2006.01) |

(52) U.S. Cl.
CPC ........ *H01L 27/3272* (2013.01); *H01L 27/1214* (2013.01); *H01L 29/41733* (2013.01); *H01L 29/78633* (2013.01); *H01L 29/458* (2013.01)
USPC .................. 257/40; 313/504; 345/46; 438/99

(58) Field of Classification Search
USPC .................. 257/40; 303/504; 345/46; 438/99
See application file for complete search history.

(56) References Cited

U.S. PATENT DOCUMENTS

| | | | |
|---|---|---|---|
| 5,990,555 A | 11/1999 | Ohori et al. | |
| 6,316,790 B1 * | 11/2001 | Kodaira et al. ................. | 257/72 |
| 7,230,592 B2 * | 6/2007 | Sato et al. ....................... | 345/76 |
| 2003/0193792 A1 * | 10/2003 | Chang .......................... | 361/778 |
| 2003/0201716 A1 * | 10/2003 | Yamazaki et al. ............. | 313/506 |
| 2003/0227021 A1 * | 12/2003 | Yamazaki et al. .............. | 257/83 |
| 2005/0174520 A1 | 8/2005 | Tomihari | |
| 2005/0247938 A1 * | 11/2005 | Okamoto et al. ............... | 257/59 |
| 2006/0267030 A1 * | 11/2006 | Yamazaki et al. .............. | 257/83 |

(Continued)

FOREIGN PATENT DOCUMENTS

JP 2003-317971 A 11/2003

OTHER PUBLICATIONS

Office Action from the Korean Patent Office dated Dec. 31, 2012 for counterpart Korean Patent Application No. 10-2008-0080687.

*Primary Examiner* — Mark Tornow
(74) *Attorney, Agent, or Firm* — Morgan, Lewis & Bockius LLP

(57) ABSTRACT

An organic electroluminescence device and a method for manufacturing the same are disclosed. The organic electroluminescence device includes a transparent substrate, a semiconductor layer including a source region, a channel region and a drain region, a gate insulating film having first contact holes on the source and drain regions and formed on the substrate including the semiconductor layer, a gate electrode formed on the gate insulating film above the channel region, an interlayer insulating film having second contact holes on the source and drain regions and formed on an entire surface of the gate insulating film including the gate electrode, and a source electrode and a drain electrode formed on the interlayer insulating film to be electrically connected to the source and drain regions through the first and second contact holes, wherein at least one of the source electrode and the drain electrode is formed to cover the semiconductor layer.

8 Claims, 5 Drawing Sheets

(56) References Cited

U.S. PATENT DOCUMENTS

| | | | |
|---|---|---|---|
| 2007/0048946 A1* | 3/2007 | Ramaswamy et al. | 438/283 |
| 2007/0159565 A1* | 7/2007 | Segawa et al. | 349/38 |
| 2008/0246037 A1* | 10/2008 | Kang et al. | 257/72 |
| 2010/0163854 A1* | 7/2010 | Kho et al. | 257/40 |

* cited by examiner

ORGANIC ELECTROLUMINESCENCE DEVICE AND METHOD FOR MANUFACTURING THE SAME

CROSS-REFERENCE TO RELATED APPLICATION

This application claims the benefit of Korean Patent Application No. 10-2007-0093077, filed on Sep. 13, 2007, and of Korean Patent Application No. 10-2008-0080687, filed on Aug. 19, 2008, which are hereby incorporated by reference in its entirety as if fully set forth herein.

BACKGROUND OF THE INVENTION

1. Field of the Invention

The present invention relates to an organic electroluminescence device and a method for manufacturing the same, and more particularly to an electrode structure of a thin film transistor of an organic electroluminescence device serving as a driving switch and a method for fabricating the organic electroluminescence device.

2. Discussion of the Related Art

In a multimedia age, it is required for a display device to be finer and larger and to express colors close to natural colors. There are limits to a conventional cathode ray tube (CRT) in offering a large screen of 40 inches or more. An organic electroluminescence device, a liquid crystal display device (LCD), a plasma display panel (PDP) and a projection TV (Television) and the like are developing at a high speed to be widely used in a field of high-definition images.

Among the above-mentioned display devices, the organic electroluminescence device is a device emitting light in the following manner; if electric charges are injected in an organic film formed between a cathode and an anode, electrons and holes in pairs become extinct to emit light. Accordingly, the organic electroluminescence device can be formed on a flexible transparent substrate such as plastic. Further, the organic electroluminescence device can be operated at a low voltage (below about 10 V) compared to a plasma display panel or an inorganic electroluminescence device. Further, since the organic electroluminescence device has advantages of relatively low power consumption and excellent color sensation, the organic electroluminescence device has been given attention as a next-generation display device. Further, in order to operate the organic electroluminescence device at a low voltage, it is important to maintain a very thin and uniform thickness (about 100-200 nm) of the organic film and stability of the device.

The organic electroluminescence devices are classified into a passive matrix type organic electroluminescence device operated under switch control of electrical signals and an active matrix type organic electroluminescence device operated using thin film transistors (TFT) according to a driving method of sub-pixels.

A conventional active matrix type organic electroluminescence device is described below.

In the conventional active matrix type organic electroluminescence device, a thin film transistor is formed on the transparent substrate. In this case, the thin film transistor includes a active layer having a source region, a drain region and a channel region, a gate insulating film, a gate electrode, an interlayer insulating film and source/drain electrodes. The source and drain regions contact with the source electrode and the drain electrode through contact holes formed in the interlayer insulating film and the gate insulating film, respectively.

Further, a planarization film is formed of an organic material on the substrate having the thin film transistor. Further, an anode is formed on the planarization film to be electrically connected to the drain electrode. Further, an organic light-emitting layer is formed on the anode electrode, and a cathode electrode is formed on the organic light-emitting layer. In this case, the organic light-emitting layer includes a hole transporting layer, red, green and blue light-emitting layers and an electron transporting layer.

In this case, the hole transporting layer includes a hole injecting layer and a hole transfer layer. The electron transporting layer includes an electron transfer layer and an electron injecting layer.

However, the above-mentioned conventional organic electroluminescence device has the following problems.

In the conventional active matrix type organic electroluminescence device, the thin film transistor can be exposed to X-ray or the like in a deposition process of an anode, a light-emitting layer and a cathode, thereby causing damage to the thin film transistor. Further, there is a problem of reducing an electrical contact between the source/drain electrode layers.

SUMMARY OF THE INVENTION

Accordingly, the present invention is directed to an organic electroluminescence device and a method for manufacturing the same that substantially obviate one or more problems due to limitations and disadvantages of the related art.

An object of the present invention is to provide an organic electroluminescence device capable of protecting a thin film transistor from X-ray or the like in a deposition process of an anode, a light-emitting layer and a cathode and improving the interfacial characteristics of the source and drain electrodes in an active matrix type organic electroluminescence device, and a method for manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic electroluminescence device comprises: a transparent substrate; a semiconductor layer including a source region, a channel region and a drain region; a gate insulating film having first contact holes on the source region and the drain region and formed on the substrate including the semiconductor layer; a gate electrode formed on the gate insulating film above the channel region; an interlayer insulating film having second contact holes on the source region and the drain region and formed on an entire surface of the gate insulating film including the gate electrode; and a source electrode and a drain electrode formed on the interlayer insulating film to be electrically connected to the source region and the drain region through the first and second contact holes, wherein at least one of the source electrode and the drain electrode is formed to cover the semiconductor layer.

In accordance with another purpose of the invention, a method for manufacturing organic electroluminescence device comprises: forming a semiconductor layer including a source region, a channel region and a drain region on a substrate; forming a gate insulating film on the substrate including the semiconductor layer; forming a gate electrode on the gate insulating film above the channel region; forming an interlayer insulating film on an entire surface of the gate insulating film including the gate electrode; forming first contact holes in the gate insulating film and the interlayer insulating film to expose the source region and the drain region; and forming a source electrode and a drain electrode on the interlayer insulating film to be electrically connected to the source region and the drain region through the first contact holes, wherein at least one of the source electrode and the drain electrode is formed to cover the semiconductor layer.

The organic electroluminescence device and the method for manufacturing the same according to the present invention have the following effects.

That is, in the active matrix type organic electroluminescence device, since the active layer of the thin film transistor is covered by the source electrode, the gate electrode and the drain electrode, it is possible to prevent the active layer of the thin film transistor from being damaged due to X-ray or the like in a deposition process of the anode, the organic light-emitting layer and the cathode.

Further, since the source electrode and the drain electrode are formed to have a three-layer structure, it is possible to improve the interfacial characteristics of the source and drain electrodes, thereby increasing an electrical contact.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
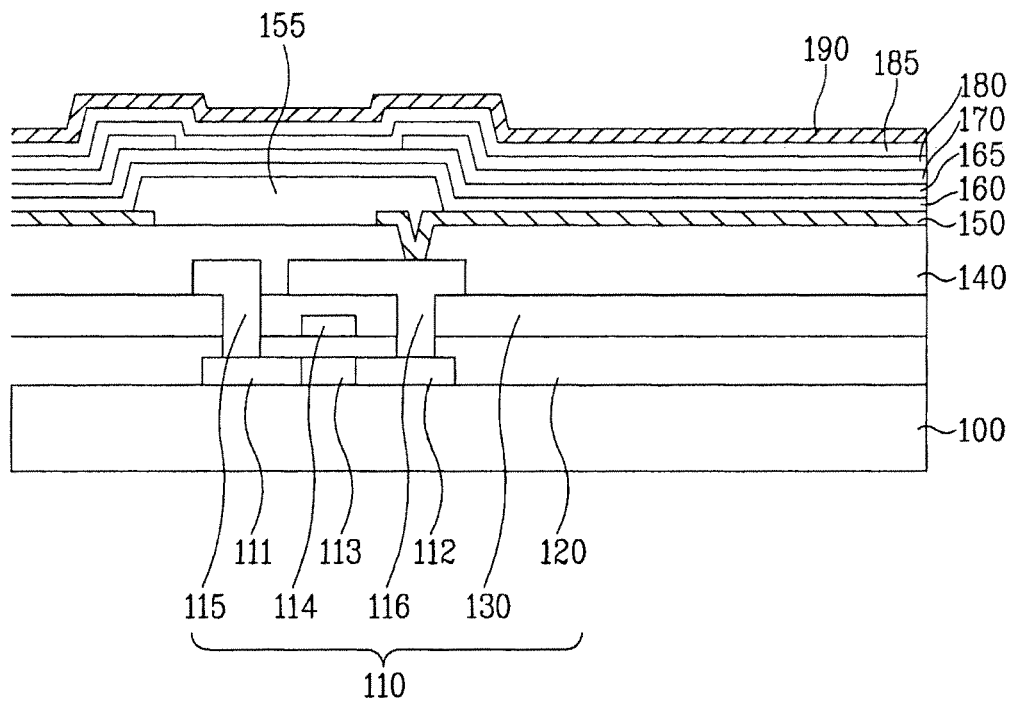
FIG. 1 illustrates a cross-sectional view showing an organic electroluminescence device according to an embodiment of the present invention.

Reference will now be made in detail to the preferred embodiments of the present invention, examples of which are illustrated in the accompanying drawings. Wherever possible, the same reference numbers will be used throughout the drawings to refer to the same or like parts.

Hereinafter, an organic electroluminescence device and a method for manufacturing the same according to the present invention will be described in detail with reference to the accompanying drawings.

A dimension of a thickness is enlarged in the accompanying drawings to clearly represent several layers and regions. A thickness ratio of respective layers shown in the drawings is not equal to an actual thickness ratio. Meanwhile, when a portion such as a layer, a film, a region and a plate is formed or disposed "on" the other portion, it should be understood that the portion may be formed directly on the other portion through a direct contact, or another portion may be disposed therebetween.

Figure 2:
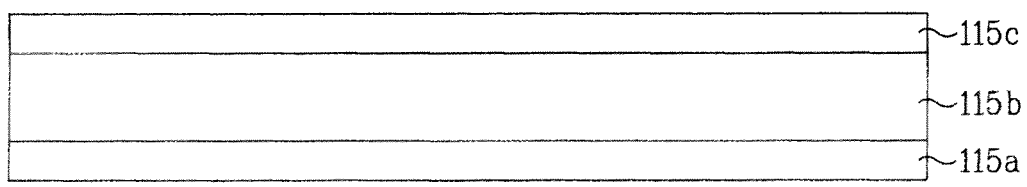
FIG. 2 illustrates a cross-sectional view of source and drain electrodes of FIG. 1.
Figure 3:
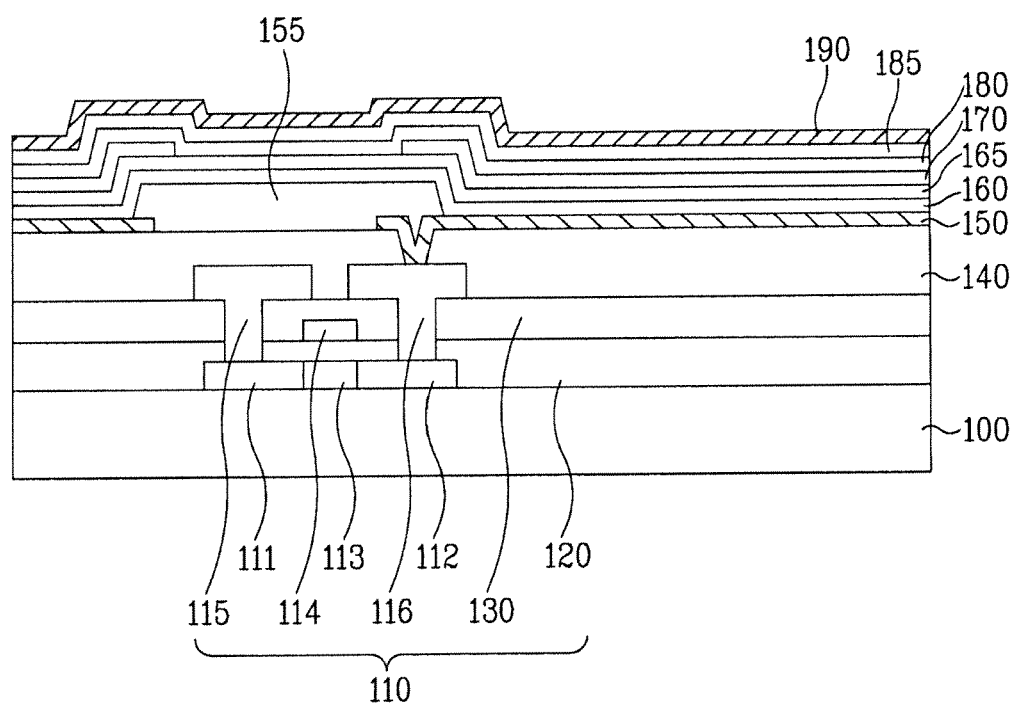
FIG. 3 illustrates a cross-sectional view of an organic electroluminescence device according to another embodiment of the present invention.

FIG. 1 illustrates a cross-sectional view of an organic electroluminescence device according to an embodiment of the present invention. FIG. 2 illustrates a cross-sectional view of source and drain electrodes. FIG. 3 illustrates a cross-sectional view of an organic electroluminescence device according to another embodiment of the present invention. The organic electroluminescence device according to the embodiments of the present invention is described with reference to FIGS. 1 to 3.

As shown in FIGS. 1 to 3, in the active matrix type organic electroluminescence device according to the embodiments of the present invention, a thin film transistor 110 is formed on a transparent substrate 100.

In this case, the transparent substrate 100 may be formed of glass, quartz, sapphire or the like. Further, although not shown in the drawings, an insulating film may be formed between the transparent substrate 100 and the thin film transistor 110 to prevent various impurities in the transparent substrate from infiltrating into the thin film transistor.

The configuration of the thin film transistor 110 is explained in detail. That is, a semiconductor layer having a source region 111, a drain region 112 and a channel region 113 is formed in an island shape on the transparent substrate 100. A gate insulating film 120 is formed on the entire surface of the substrate including the semiconductor layer having the source region 111, the drain region 112 and the channel region 113. A gate electrode 114 is formed on the gate insulating film 120 above the channel region 113. An interlayer insulating film 130 is formed on the entire surface of the substrate including the gate electrode 114. Contact holes are formed in the gate insulating film 120 and the interlayer insulating film 130 to expose the source region 111 and the drain region 112. A source electrode 115 and a drain electrode 116 are formed on the interlayer insulating film 130 to be electrically connected to the source region 111 and the drain region 112 through the contact holes, respectively.

In this case, at least one electrode of the gate electrode 114, the source electrode 115 and the drain electrode 116 has a three-layer structure as shown in FIG. 2. That is, the three-layer structure has a stacked structure of a surfactant layer 115a, a conductive layer 115b and a passivation layer 115c.

In this case, the surfactant layer 115a is formed of titanium (Ti), molybdenum (Mo) or the like and has a thickness of 30~100 nm.

The conductive layer 115b is formed of a material selected from a group consisting of chromium (Cr), copper (Cu), gold (Au), nickel (Ni), silver (Ag), tantalum (Ta), aluminum (Al) and aluminum neodymium (AlNd). The conductive layer 115b has a thickness of 200~500 nm.

The passivation layer 115c is formed of titanium (Ti), tungsten (W) or the like and has a thickness of 30~100 nm. The passivation layer 115c has an X-ray transmittance of 0.001~1.0%.

In this case, the passivation layer 115c protects the transistor from damage due to X-ray and the like generated when an anode, a luminous layer and a cathode are formed later. Accordingly, it is ideal to completely block X-ray, but realistically, the passivation layer 115c is formed to have a thickness within the above-mentioned range using the above-mentioned materials.

In this case, the conductive layer 115b is formed to have a thickness of 200~500 nm with regard to the volume and weight while ensuring the electric conductivity. Further, both the surfactant layer 115a and the passivation layer 115c can prevent the conductive layer 115b from being damaged due to X-ray and the like in a deposition process of the organic electroluminescence device. Further, the surfactant layer 115a may be formed of Mo in addition to Ti with regard to the interfacial adhesive strength of the source electrode.

A Mo layer having a thickness of 200 nm has an X-ray transmittance of 0.22%, and a Mo layer having a thickness of 400 nm has an X-ray transmittance of 0.0005%. If the surfactant layer 115a has a thickness of 30~100 nm as described above, the surfactant layer 115a has an X-ray transmittance of 0.1~0.5%. However, when the surfactant layer 115a or the passivation layer 115c is thickly formed, although an X-ray shielding effect increases, there is a problem that the volume and weight of the device become larger. Accordingly, the surfactant layer 115a and the passivation layer 115c are formed to have a thickness within the above-mentioned range.

Further, a material such as lead (Pb) has a high X-ray shielding effect, but has a low interfacial adhesive strength. Accordingly, the surfactant layer 115a is formed of molybdenum (Mo) or the like to have the above-mentioned X-ray shielding effect. The surfactant layer 115a and the passivation layer 115c may be formed of any other materials capable of shielding X-rays and improving the interfacial adhesive strength. Further, preferably, the surfactant layer 115a and the passivation layer 115c formed of the above-mentioned materials have a thickness of 30~100 nm with regard to the X-ray shielding effect and the volume. Further, the source electrode 115 or the drain electrode 116 having the above-described structure has an X-ray transmittance of 0.001~0.1%, thereby reducing the weight and volume while providing the X-ray shielding effect and protecting the transistor. If only one layer of the passivation layer and the surfactant layer is thickly formed, the satisfied X-ray shielding effect can be achieved, but a problem may occur in the interfacial adhesive strength with the transistor At least one electrode of the source electrode 115 and the drain electrode 116 having a three-layer structure as described above is formed to cover the semiconductor layer of the thin film transistor having the source region 111, the drain region 112 and the channel region 113 as shown in FIG. 1.

Further, as another example, the gate electrode 114, the source electrode 115 and the drain electrode 116 having a three-layer structure as described above are formed to cover the semiconductor layer of the thin film transistor having the source region 111, the drain region 112 and the channel region 113 as shown in FIG. 3.

Further, a planarization film 140 is formed on the entire surface of the substrate including the thin film transistor 110 for planarization of a pixel region. In this case, the planarization film 140 may be formed of an organic insulating material such as an acrylic organic compound, polyimide, benzo-cyclo-butene (BCB) or PFCB. Further, the planarization film 140 may be formed of an inorganic insulating material such as silicon nitride.

Further, a contact hole is formed in the planarization film 140 to expose a specific portion of the drain electrode 116. Then, an anode electrode 150 is formed on the planarization film 140 in the pixel region to be electrically connected to the drain electrode 116 through the contact hole. In this case, the anode electrode 150 is formed of a transparent conductive film, for example, indium-tin-oxide (ITO) or indium-zinc-oxide (IZO) to transmit light.

A pixel isolation film 155 is formed on the planarization film 140 between the pixel regions. The pixel isolation film 155 may be formed of an inorganic insulating material such as silicon nitride (Sinx) or silicon oxide (SiO2).

An organic light-emitting layer and a cathode electrode 190 are sequentially formed on the pixel isolation film 155 and the anode electrode 150.

The organic light-emitting layer is formed by sequentially stacking a hole injection layer 160, a hole transporting layer 165, a light-emitting layer 170, an electron transporting layer 180 and an electron injection layer 185. Further, the cathode electrode 190 of the organic electroluminescence device is stacked on the organic light-emitting layer.

In this case, the electron transporting layer 180 is provided between the light-emitting layer 170 and the cathode electrode 190. Accordingly, most of electrons injected into the light-emitting layer 170 from the cathode electrode 190 move toward the anode electrode 150 to be recombined with holes. Further, the hole transporting layer 165 is provided between the anode electrode 150 and light-emitting layer 170. Accordingly, the electrons injected into the light-emitting layer 170 exist only in the light-emitting layer 170 without moving toward the anode electrode 150 due to an interface with the hole transporting layer 165, thereby improving the recombination efficiency.

The method for manufacturing the organic electroluminescence device having the above configuration according to the present invention will be described in detail with reference to the accompanying drawings.

FIGS. 4A to 4E illustrate a method for manufacturing an organic electroluminescence according to an embodiment of the present invention.

Figure 4A:
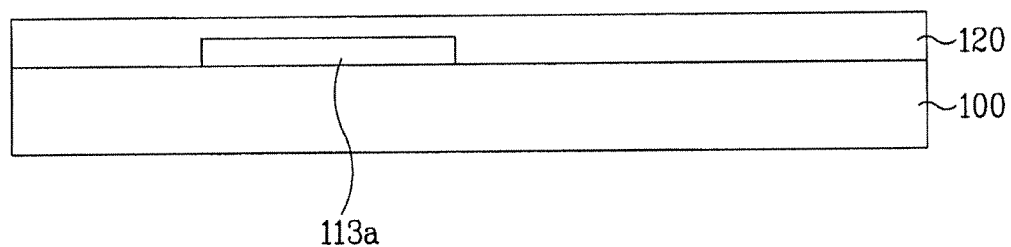
FIGS. 4A to 4E illustrate a method for manufacturing an organic electroluminescence according to an embodiment of the present invention.

As shown in FIG. 4A, the transparent substrate 100 formed of glass, quartz, sapphire or the like is prepared. An amorphous silicon film is formed on the transparent substrate 100 to have a thickness of about 200~800 Å by low pressure chemical vapor deposition, plasma enhanced chemical vapor deposition or the like. Further, the amorphous silicon film is crystallized into a polycrystalline silicon film by a laser annealing method or the like. Of course, the polycrystalline silicon film may be directly deposited instead of the amorphous silicon film.

Then, the polycrystalline silicon film is patterned by, for example, a photolithography process to form an active layer 113a of the thin film transistor in a unit pixel. Then, the gate insulating film 120 is deposited on the entire surface of the substrate including the active layer 113a.

Figure 4B:
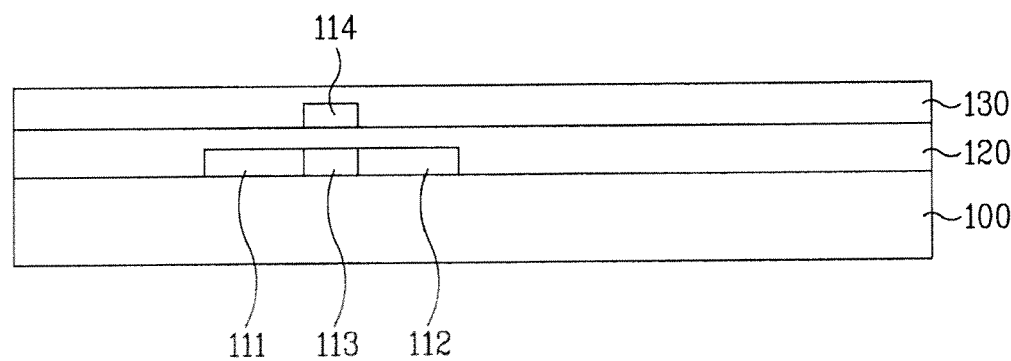

As shown in FIG. 4B, the gate electrode 114 is formed on the gate insulating film 120 above the active layer 113a. That is, aluminum neodymium (AlNd) is deposited on the gate insulating film 120 to have a thickness of about 1500~5000 Å by a sputtering method. Then, the aluminum neodymium (AlNd) is patterned by a photolithography process to form the gate electrode 114.

Then, impurity ions are implanted into the active layer 113a using the gate electrode 114 as a mask. The implanted impurity ions are activated to form the source region 111 and the drain region 112 of the thin film transistor. In this case, since impurity ions are not implanted into the active layer 113a under the gate electrode 114, the channel region 113 is naturally formed.

Further, the interlayer insulating film 130 is formed of a silicon oxide film or a silicon nitride film on the entire surface of the substrate including the gate electrode 114.

Figure 4C:
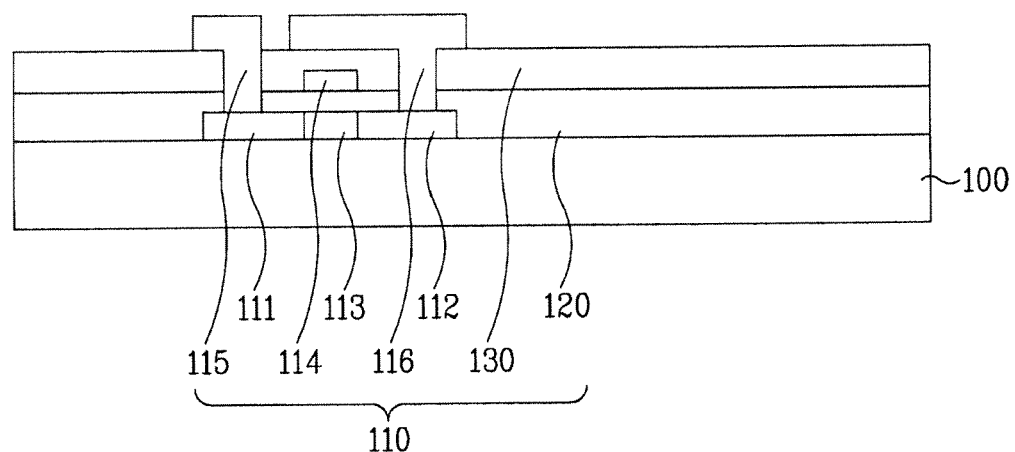

As shown in FIG. 4C, the gate insulating film 120 and the interlayer insulating film 130 are selectively removed to expose the source region 111 and the drain region 112, thereby forming the contact holes.

Further, at least one metal layer (e.g., three layers) is deposited on the interlayer insulating film 130 and the metal layer is removed by a photolithography process to form the source electrode 115 and the drain electrode 116 electrically connected to the source region 111 and the drain region 112.

A process for forming the source electrode 115 and the drain electrode 116 is described in detail.

That is, titanium (Ti), molybdenum (Mo) or the like is deposited at a thickness of 30~100 nm to form the surfactant layer 115a. Then, a material selected from a group consisting of chromium (Cr), copper (Cu), gold (Au), nickel (Ni), silver (Ag), tantalum (Ta), aluminum (Al) and aluminum neodymium (AlNd) is deposited on the surfactant layer 115a at a thickness of 200~500 nm to form the conductive layer 115b. Then, titanium (Ti), tungsten (W) or the like is deposited on the conductive layer 115b at a thickness of 30~100 nm to form the passivation layer 115c.

In this case, the surfactant layer 115a has an X-ray transmittance of 0.1~0.5%. The passivation layer 115c has an X-ray transmittance of 0.2~1.0%.

Further, the surfactant layer 115a, the conductive layer 115b and the passivation layer 115c are selectively removed to from the source electrode 115 and the drain electrode 116. The surfactant layer 115a increases the interfacial adhesive strength of the source electrode to provide stability of the device. The source electrode 115 and the drain electrode 116 are formed to have an X-ray transmittance of 0.001~0.1%.

In this case, at least one electrode of the source electrode 115 and the drain electrode 116 is formed to cover the active layer of the thin film transistor having the source region 111, the drain region 112 and the channel region 113.

Further, as another example, the gate electrode 114, the source electrode 115 and the drain electrode 116 are formed to cover the active layer of the thin film transistor having the source region 111, the drain region 112 and the channel region 113 as shown in FIG. 3.

Further, the gate electrode 114 may have a three-layer structure in the same way as the source electrode 115 and the drain electrode 116.

Figure 4D:
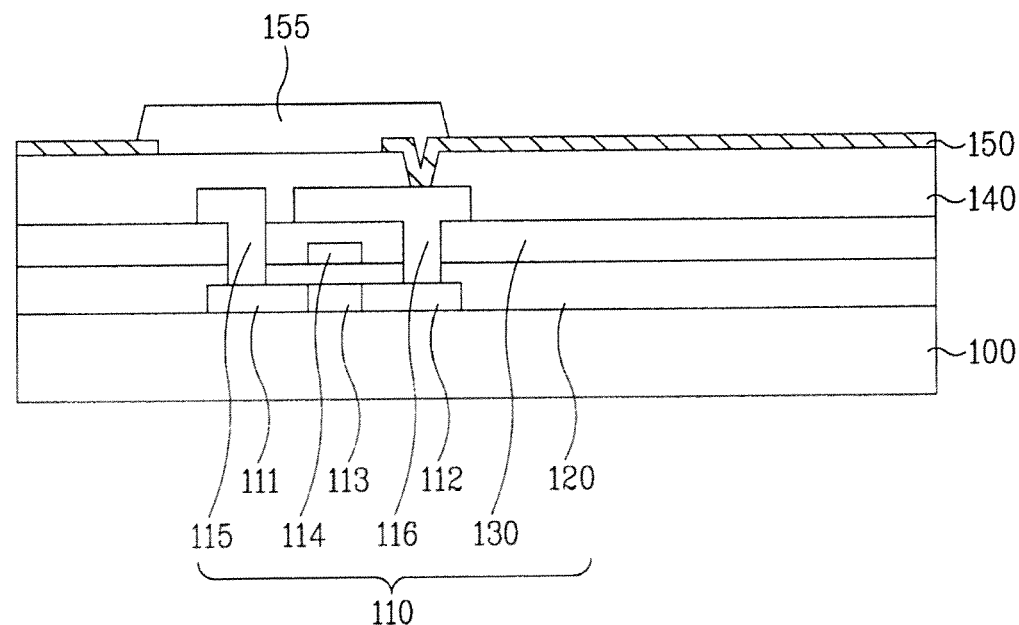

As shown in FIG. 4D, the planarization film 140 is formed on the entire surface of the interlayer insulating film 130 including the thin film transistor 110. In this case, the planarization film 140 is provided for planarization of the anode and is formed by depositing an organic or inorganic insulating material at a thickness of about 1000~5000 Å.

The planarization film 140 is etched by a photolithography process to form a contact hole exposing the source electrode 115 or the drain electrode 116 (the drain electrode 116 in the drawing).

The transparent conductive film, for example, ITO or IZO, is deposited on the planarization film 140 including the contact hole and is patterned by a photolithography process, thereby forming the anode electrode 150 in the pixel region to be electrically connected to the drain electrode 116 through the contact hole.

Further, the inorganic insulating film made of silicon nitride or silicon oxide is deposited on the entire surface of the resultant structure at a thickness of about 1000~2000 Å. Then, the inorganic insulating film is patterned to remain only a peripheral portion of the pixel region, thereby forming the pixel isolation film 155.

Figure 4E:
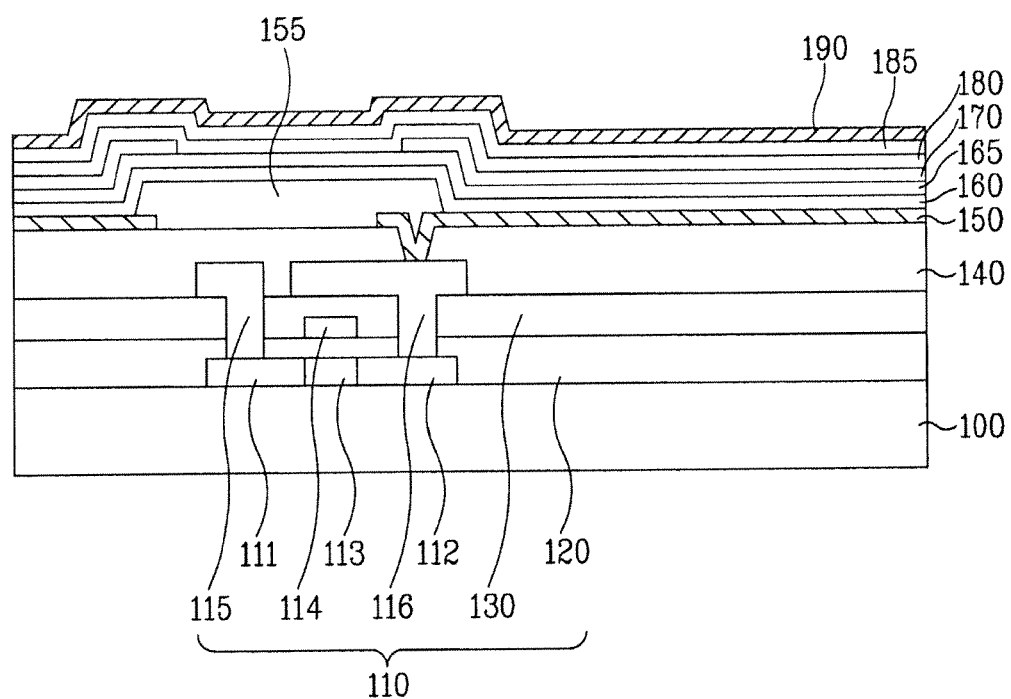

As shown in FIG. 4E, the organic light-emitting layer is formed by sequentially stacking the hole injection layer 160, the hole transporting layer 165, the light-emitting layer 170, the electron transporting layer 180 and the electron injection layer 185. Further, the cathode electrode 190 of the organic electroluminescence device is formed on the entire surface of the resultant structure at a specific thickness.

In this case, the hole injection layer 160 is formed by depositing copper phthalocyanine (CuPC) at a thickness of 10~30 nm. Further, the hole transporting layer 165 is formed by depositing 4,4'-bis[N-1-napthyl-N-phenyl-amino]biphenyl (NPB) at a thickness of 30~60 nm. Further, the light-emitting layer 170 is formed of an organic light-emitting material according to red, green and blue pixels while adding a dopant if necessary.

In this case, at least one of processes for forming the anode, the organic light-emitting layer and the cathode employs electron beam (X-ray).

The reason for forming the anode, the organic light-emitting layer and the cathode using the electron beam is to improve the light-emitting characteristics of the organic light-emitting layer by performing the above-mentioned processes in the same chamber. That is, when the organic light-emitting layer is deposited and the cathode is deposited in a sputtering apparatus by a sputtering method, the organic light-emitting layer is exposed to air to reduce the light-emitting characteristics or complicate the deposition process.

As described above, even though the electron beam is used in the processes for forming the anode, the organic light-emitting layer and the cathode, the active layer of the thin film transistor is covered by the source electrode 115 and the drain electrode 116. Thus, it is possible to prevent the active layer of the thin film transistor from being damaged.

In the organic electroluminescence device and the method for manufacturing the same according to the present invention, it is possible to improve the interfacial characteristics of the source and drain electrodes and prevent damage of the active layer of the than film transistor due to, particularly, X-ray. Thus, it is possible to improve the performance of the organic electroluminescence device and prolong the life span of the organic electroluminescence device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic electroluminescence device comprising:
   a transparent substrate;
   a semiconductor layer including a source region, a channel region and a drain region;
   a gate insulating film having first contact holes on the source region and the drain region and formed on the substrate including the semiconductor layer;
   a gate electrode formed on the gate insulating film above the channel region;
   an interlayer insulating film having second contact holes on the source region and the drain region and formed on an entire surface of the gate insulating film including the gate electrode;
   a source electrode and a drain electrode formed on the interlayer insulating film to be electrically connected to the source region and the drain region through the first and second contact holes;
   a planarization film having a third contact hole on the drain electrode and formed on an entire surface of the substrate having the source and drain electrodes;
   a pixel isolation film on the planarization film at a portion over the channel region to be between a pixel region and an adjacent pixel region;

an anode electrode formed on the planarization film in the pixel region to be electrically connected to the drain electrode through the third contact hole;

an organic light-emitting layer formed on the anode electrode and the pixel isolation film; and a cathode electrode formed on the organic light-emitting layer, wherein at least one of the source electrode and the drain electrode is formed to cover the channel region, and wherein the portion of the at least one of the source electrode and the drain electrode covering the channel region has an X-ray transmittance of 0.001~0.1% and is formed to have a three-layer structure of three electrically conductive metal layers, wherein the three-layer structure includes a surfactant layer made of titanium (Ti) or molybdenum (Mo); a conductive layer formed on the surfactant layer and made of a material selected from a group consisting of chromium (Cr), copper (Cu), gold (Au), nickel (Ni), silver (Ag), tantalum (Ta), aluminum (Al) and aluminum neodymium (AlNd); and a passivation layer formed on the conductive layer and consisting of titanium (Ti) or tungsten (W), wherein the organic light-emitting layer includes a hole injecting layer, a hole transporting layer, a light emitting layer, an electron transporting layer and an electron injection layer, and wherein the hole injecting layer, the hole transporting layer, the electron transporting layer and the electron injection layer are present on the pixel isolation film over the channel region, and the light emitting layer is absent on the pixel isolation film over the channel region.

2. The organic electroluminescence device according to claim 1, wherein the conductive layer is formed to have a thickness of 200~500 nm.

3. The organic electroluminescence device according to claim 1, wherein the passivation layer has a thickness of 30~100 nm and an X-ray transmittance of 0.2~1.0%.

4. The organic electroluminescence device according to claim 1, wherein the surfactant layer has a thickness of 30~100 nm and an X-ray transmittance of 0.1~0.5%.

5. The organic electroluminescence device according to claim 1, wherein the semiconductor layer is covered by the gate electrode, the source electrode and the drain electrode.

6. The organic electroluminescence device according to claim 1, wherein one of the source electrode and the drain electrode is formed to completely cover the channel region of the semiconductor layer.

7. The organic electroluminescence device according to claim 1, wherein the cathode is present over the channel region.

8. The organic electroluminescence device according to claim 1, wherein the anode is absent over the channel region.

* * * * *